United States Patent
Zhang et al.

(10) Patent No.: US 10,643,561 B2
(45) Date of Patent: May 5, 2020

(54) DRIVING CIRCUIT, ARRAY SUBSTRATE AND DISPLAY DEVICE

(71) Applicants: Shanghai AVIC OPTO Electronics Co., Ltd., Shanghai (CN); Tianma Micro-electronics Co., Ltd., Shenzhen (CN)

(72) Inventors: Weiwei Zhang, Shanghai (CN); Meilin Wang, Shanghai (CN); Jun Li, Shanghai (CN)

(73) Assignees: Shanghai AVIC OPTO Electronics Co., Ltd., Shanghai (CN); Tianma Micro-electronics Co., Ltd., Shen (CN)

( * ) Notice: Subject to any disclaimer, the term of this patent is extended or adjusted under 35 U.S.C. 154(b) by 0 days.

(21) Appl. No.: 15/188,631

(22) Filed: Jun. 21, 2016

(65) Prior Publication Data

US 2017/0178583 A1  Jun. 22, 2017

(30) Foreign Application Priority Data

Dec. 18, 2015  (CN) .......................... 2015 1 0958037

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2300/0404* (2013.01); *G09G 2300/0413* (2013.01); *G09G 2300/0421* (2013.01); *G09G 2310/0286* (2013.01); *G09G 2320/0223* (2013.01); *G09G 2320/0233* (2013.01)

(58) Field of Classification Search
CPC .............................................. G09G 2310/0286
See application file for complete search history.

(56) References Cited

U.S. PATENT DOCUMENTS

| 6,295,046 | B1* | 9/2001 | Hebiguchi | G11C 19/184 345/100 |
| 7,253,865 | B2* | 8/2007 | Battersby | G02F 1/13336 257/293 |
| 8,638,280 | B2* | 1/2014 | Nonaka | G09G 3/20 345/76 |
| 8,860,706 | B2* | 10/2014 | Sakamoto | G11C 19/184 345/204 |
| 9,244,317 | B2* | 1/2016 | Ogasawara | G02F 1/13454 |
| 9,311,855 | B2* | 4/2016 | Jung | G06F 1/163 |
| 9,312,284 | B2* | 4/2016 | Wu | H01L 27/124 |
| 9,620,077 | B2* | 4/2017 | Shih | G09G 5/00 |
| 9,685,105 | B2* | 6/2017 | Kim | G09G 3/20 |

(Continued)

FOREIGN PATENT DOCUMENTS

| CN | 101779227 A | 7/2010 |
| CN | 103487962 A | 1/2014 |

(Continued)

*Primary Examiner* — Patrick F Marinelli
(74) *Attorney, Agent, or Firm* — Anova Law Group PLLC

(57) ABSTRACT

A driving circuit, an array substrate and a display device are provided. The driving circuit includes a plurality of cascaded shift registers. Each shift register includes a plurality of transistors and at least one capacitor, and a channel width-to-length ratio of at least one transistor is determined by a preset number of pixels in a pixel row driven by the corresponding shift register.

15 Claims, 4 Drawing Sheets

(56) References Cited

U.S. PATENT DOCUMENTS

| | | | | |
|---|---|---|---|---|
| 2005/0225690 A1* | 10/2005 | Battersby | ............ | G02F 1/13336 |
| | | | | 349/41 |
| 2008/0266210 A1* | 10/2008 | Nonaka | ................... | G09G 3/20 |
| | | | | 345/55 |
| 2010/0141570 A1* | 6/2010 | Horiuchi | .............. | G09G 3/3611 |
| | | | | 345/100 |
| 2011/0157112 A1 | 6/2011 | Shibata et al. | | |
| 2015/0053986 A1* | 2/2015 | Umezaki | ............ | H01L 27/0733 |
| | | | | 257/71 |
| 2015/0061982 A1* | 3/2015 | Woo | ..................... | G09G 3/3266 |
| | | | | 345/82 |
| 2016/0005346 A1* | 1/2016 | Kim | ..................... | G09G 3/3266 |
| | | | | 345/690 |
| 2017/0178583 A1* | 6/2017 | Zhang | .................. | G09G 3/3677 |
| 2019/0219880 A1* | 7/2019 | Suzuki | ................ | G02F 1/13306 |

FOREIGN PATENT DOCUMENTS

| | | | | |
|---|---|---|---|---|
| CN | 103943053 | A | * | 7/2014 |
| CN | 103943053 | A | | 7/2014 |
| CN | 104464605 | A | | 3/2015 |
| CN | 104537970 | A | | 4/2015 |
| CN | 104575419 | A | | 4/2015 |
| CN | 105139822 | A | | 12/2015 |

* cited by examiner

DRIVING CIRCUIT, ARRAY SUBSTRATE AND DISPLAY DEVICE

CROSS-REFERENCES TO RELATED APPLICATIONS

This application claims the priority of Chinese patent application No. CN201510958037.X, filed on Dec. 18, 2015, the entire content of which is incorporated herein by reference.

FIELD OF THE DISCLOSURE

The present disclosure relates to the field of display technology and, more particularly, relates to a driving circuit, an array substrate including the driving circuit and a corresponding display device including the array substrate.

BACKGROUND

With the continuous development of terminal technologies, display screens configured with various intelligent terminals are no longer limited to traditional rectangular screens, but are transforming to non-rectangular screens, in order to better meet diversified demands from users.

For a non-rectangular display screen, the total number of pixels in each row (i.e., pixel row) is not exactly the same, thus the driving load of each pixel row is different. Because different loads cause different signal delays, the pixel rows cannot uniformly display an image, which results a degraded image performance in the non-rectangular display screen.

The disclosed driving circuit, array substrate and display device are directed to solve one or more problems in the art.

BRIEF SUMMARY OF THE DISCLOSURE

One aspect of the present disclosure provides a pixel circuit.

Another aspect of the present disclosure provides a driving circuit. The driving circuit includes a plurality of cascaded shift registers. Each shift register includes a plurality of transistors and at least one capacitor, and a channel width-to-length ratio of at least one transistor is determined by a preset number of pixels in a pixel row driven by the corresponding shift register.

Another aspect of the present disclosure provides an array substrate. The array substrate includes a non-rectangular pixel array, and a driving circuit including a plurality of cascaded shift registers. Each shift register includes a plurality of transistors and at least one capacitor, and a channel width-to-length ratio of at least one transistor is determined by a preset number of pixels in a pixel row driven by the corresponding shift register.

Another aspect of the present disclosure provides a display device. The display device includes an array substrate including a non-rectangular pixel array and a driving circuit having a plurality of cascaded shift registers. Each shift register includes a plurality of transistors and at least one capacitor, and a channel width-to-length ratio of at least one transistor is determined by a preset number of pixels in a pixel row driven by the corresponding shift register.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

Figure 1:
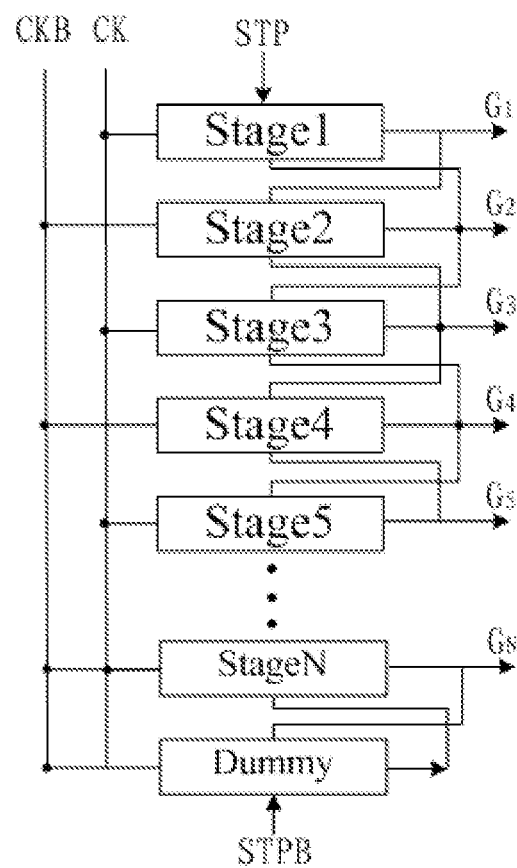
FIG. 1 illustrates an exemplary driving circuit consistent with disclosed embodiments.

FIG. 1 illustrates an exemplary driving circuit consistent with disclosed embodiments. As shown in FIG. 1, the driving circuit may include N number of cascaded shift registers (denoted as Stage 1, Stage 2 . . . Stage N) and a virtual register (Dummy) at the last stage, where N is a positive integer larger than 1. When all the shift registers are cascaded together, the shift registers may be progressively opened or switched on. Among the N number of cascaded shift registers (denoted as Stage 1, Stage 2 . . . Stage N), the first stage shift register (i.e., Stage 1) may have the lowest stage and the $N^{th}$ stage shift register (i.e., Stage N) may have the highest stage.

STP may be an external driving signal or trigger signal applied to first stage shift register Stage 1, STPB may be an external stop signal applied to the virtual register (Dummy). G1 is a first line driving signal outputted by the first stage shift register Stage 1, G2 is a second line driving signal outputted by the second stage shift register Stage 2 and so on. $G_N$ is an $N^{th}$ line driving signal outputted by the $N^{th}$ stage shift register Stage N. CKB and CK may be two phase-reversed or inverted clock signals, i.e., the clock signal CKB and the clock signal CK may be a clock signal and a clock bar signal, respectively.

Figure 2:
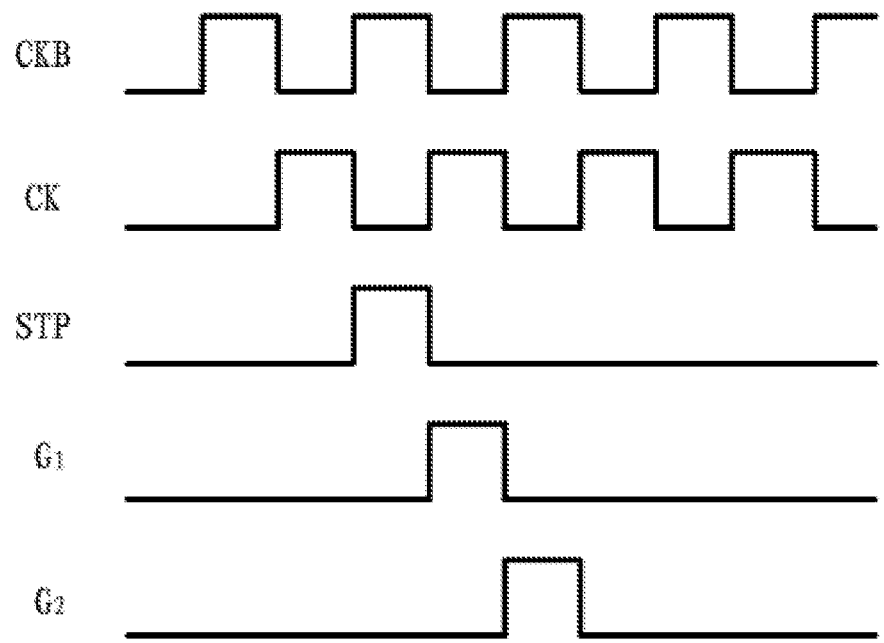
FIG. 2 illustrates an exemplary operation time sequence diagram of an exemplary driving circuit consistent with disclosed embodiments.

FIG. 2 illustrates an exemplary operation time sequence diagram of an exemplary driving circuit consistent with disclosed embodiments. The operation time sequence is illustrated in detail based on FIG. 1 and FIG. 2.

Referring to FIG. 1 and FIG. 2, when the external driving signal STP is transferred to the first stage shift register Stage 1, the first stage shift register Stage 1 may output a first line driving signal G1. Compared to the external driving signal STP, the first line driving signal G1 may be delayed by one clock signal pulse width. Meanwhile, the first line driving signal G1 may trigger the next stage shift register, i.e., the second stage shift register Stage 2, to be turned on for operation. When the second stage register Stage 2 is operational, the second stage register Stage 2 may output a second line driving signal G2 and, meanwhile, the second line driving signal G2 may be fed back to the previous shift register Stage 1 and may turn off the previous shift register Stage 1. Compared to the first line driving signal G1, the second line driving signal G2 may be delayed by one clock signal pulse width.

Thus, from the second stage shift register Stage 2 to the $N^{th}$ stage shift register Stage N, every shift register may be triggered by the driving signal outputted by the shift register which is one stage lower, and the output driving signal of every shift register may be delayed by one clock signal pulse width as compared to the shift register which is one stage lower. The last shift register Stage N may be turned off by the virtual register (Dummy) through the external stop signal STPB. CKB and CK may be two phase-reversed or inverted clock signals, i.e., the clock signal CKB and the clock signal CK may be a clock signal and a clock bar signal, respectively.

The disclosed driving circuit may be used to drive the gate electrodes in a plurality of pixel thin film transistors (TFTs), in which each TFT may control a pixel. For example, each shift register may drive the gate electrodes in a row of pixel TFTs (i.e., a pixel TFT row). That is, each shift register may drive a row of pixels (i.e., a pixel row). The output signal of the shift register may switch on the pixel TFT row, such that corresponding source signals (i.e., signals applied to the source electrodes of the pixel TFT row) may be written into the pixel TFT row, and the pixel controlled by the TFT receiving the source signal may be switched on to display image content.

In the disclosed embodiments, each pixel TFT row, i.e., each pixel row, may be individually driven by one shift register, which may offer a possibility to adjust the output signal of each shift register. Thus, different driving loads may be provided to different pixel rows in a non-rectangular display screen, and different signal delays caused by different driving loads may be eliminated. Accordingly, the image displayed by the non-rectangular display screen may be more uniform.

In the disclosed embodiments, from the second stage shift register Stage 2 to the $N^{th}$ stage shift register Stage N, the output driving signal of every shift register may be delayed by one clock signal pulse width as compared to the shift register which is one stage lower. However, in certain embodiments, the output driving signal of every shift register may be delayed by another number of clock signal pulse width as compared to the shift register which is one stage lower. For example, the output driving signal of every shift register may be delayed by two clock signal pulse widths as compared to the shift register which is one stage lower. In certain other embodiments, the output driving signal of every shift register may be delayed by a different number of clock signal pulse width as compared to the shift register which is one stage lower. For example, the second line driving signal G2 may be delayed by one clock signal pulse width as compared to the first line driving signal G1, the third line driving signal G3 may be delayed by two clock signal pulse widths as compared to the second line driving signal G2, and so on.

As described above, the disclosed driving circuit shown in FIG. 1 may include N number of cascaded shift registers (denoted as Stage 1, Stage 2 . . . Stage N), while each shift register in the driving circuit may further include a plurality of transistors and at least one capacitor, in which at least one transistor may have a channel width-to-length ratio determined by a preset number of pixels in the pixel row driven by the corresponding shift register.

Figure 3:
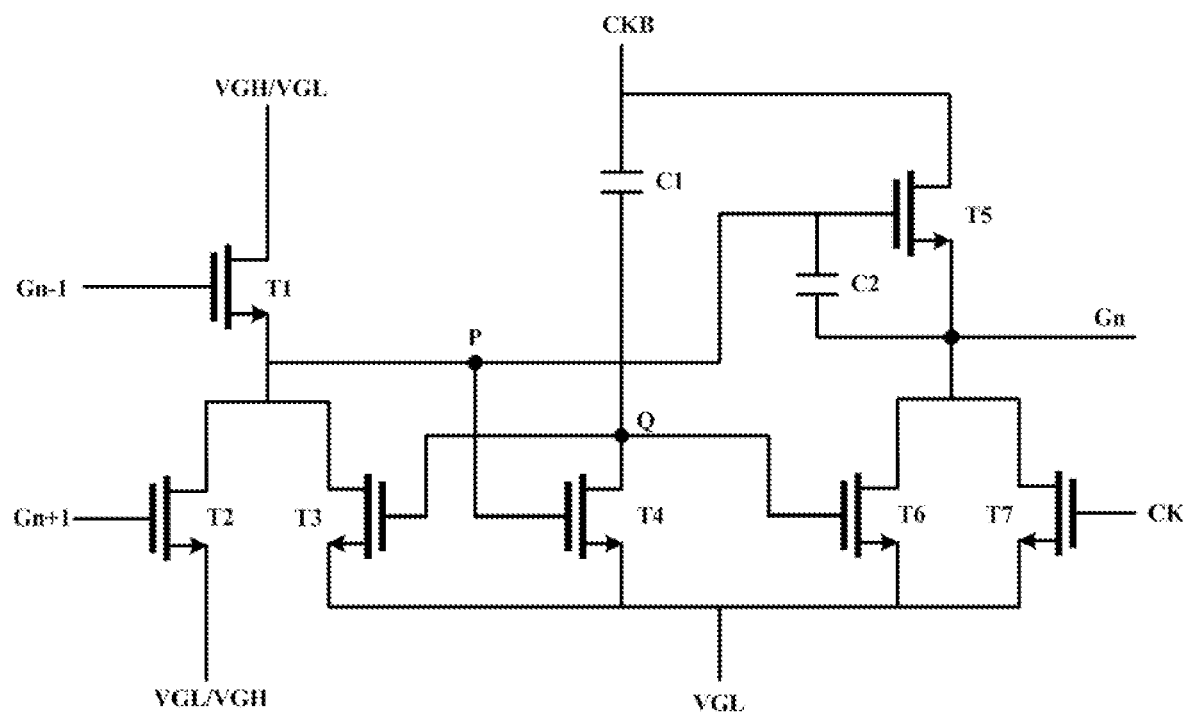
FIG. 3 illustrates an exemplary shift register in an exemplary driving circuit consistent with disclosed embodiments.

FIG. 3 illustrates an exemplary shift register in an exemplary driving circuit consistent with disclosed embodiments. For example, the shift register may be the $n^{th}$ stage shift register (i.e., Stage n) in the driving circuit having N number of shift registers (denoted as Stage 1, Stage 2 . . . Stage N). The first stage shift register (i.e., Stage 1) may have the lowest stage, and the $N^{th}$ stage shift register (i.e., Stage N) may have the highest stage. N is a positive integer larger than 1, and n is a positive integer equal to or smaller than N.

As shown in FIG. 3, the shift register (i.e., Stage n) may include a first transistor T1, a second transistor T2, a third transistor T3, a fourth transistor T4, a fifth transistor T5, a sixth transistor T6, a seventh transistor T7, a first capacitor C1 and a second capacitor C2. Among the transistors T1-T7, at least one transistor may have a channel width-to-length ratio determined by a preset number of pixels in the pixel row driven by the shift register.

The transistor may often have a gate electrode, a source electrode and a drain electrode, etc. A channel may be formed between the source electrode and the drain electrode. For example, when a proper voltage is applied on the gate electrode to switch on the transistor, negative charges may be induced on the channel of the transistor. The negative charges may create an electron flow from the source electrode to the drain electrode to make the channel conductive. When an opposite voltage is applied on the gate electrode, electrons may be depleted in the channel, thus almost no current is formed, and the transistor may be switched off.

In particular, the channel length and channel width of the transistor may reflect a carrier trapping possibility in a migration process, i.e., a possibility that the carrier is trapped in the migration process. A longer channel may exhibit a higher carrier trapping possibility, while a wider channel may exhibit a lower carrier trapping possibility. That is, in a transistor having a larger channel width-to-length ratio, the movement of carriers may be easier, the threshold voltage of the transistor may be smaller, the current flowing through the channel in the transistor may be larger, and the output voltage of the transistor may also be larger.

Thus, given the channel width-to-length ratio of the at least one transistor in the shift register is determined based on the preset number of pixels in the pixel row driven by the corresponding shift register, the output voltage of each shift register may be accordingly adjusted based on the preset number of pixels in the pixel row driven by the corresponding shift register. All the pixel rows driven by the shift registers may be able to display a uniform image.

In one embodiment, the channel width-to-length ratio of the at least one transistor in the shift register and the preset number of pixels in the pixel row driven by the corresponding shift register may be positively correlated. Because different pixel rows may have different numbers of pixels required to be driven, different pixel rows may have different driving loads. When the pixel row have more pixels required to be driven, the driving load may be larger, resulting a more obvious signal delay. The signal delay may result a non-uniform image displayed on the screen.

To eliminate the non-uniform image resulting from the signal delay, a larger driving power may be provided to the pixel row in which more pixels are going to be driven. In particular, the larger driving power may be realized through designing the channel width-to-length ratio of the at least one transistor in the shift register to be positively correlated with the preset number of pixels in the pixel row driven by the corresponding shift register. That is, when the pixel row has a larger preset number of pixels (i.e., the pixels required to be driven), the channel width-to-length ratio of the at least one transistor in the shift register driving the pixel row may be larger.

It should be noted that, in another embodiment, the channel width-to-length ratio of the at least one transistor in the shift register may be linearly or nonlinearly proportional to the preset number of pixels in the pixel row driven by the corresponding shift register.

Further, in the disclosed embodiments, the shift register may include at least one pull-up transistor. As described above, the shift register may include a plurality of transistors and at least one capacitor, different transistors may achieve different functions, for example, pulling up a voltage, pulling down a voltage, or holding a voltage. At the output terminal of the shift register, the pull-up transistor may be used to clamp the output voltage of the shift register at a high level, such that the shift register may be able to output the desired driving voltage.

Due to the voltage-pulling-up capability, the pull-up transistor may directly affect the voltage-output capability of the shift register, for example, the amplitude of the driving voltage outputted by the shift register. Thus, based on the preset number of pixels in the pixel row driven by the shift register, the channel width-to-length ratio of the pull-up transistor in the shift register may be determined. Only the channel width-to-length ratio of the pull-up transistor in the shift register may be adjusted, while the channel width-to-length ratio of the other transistors in the shift register may keep unchanged. Thus, the pixel rows may be able to display uniform images, while the cost of optimizing the driving circuit may be reduced.

Referring to FIG. 3, the second electrode of the first transistor T1, the first electrode of the second transistor T2, the first electrode of the third transistor T3, the gate electrode of the fourth transistor T4, and the gate electrode of the fifth transistor T5 may meet to form a junction P. The first plate of the second capacitor C2 may also be connected to the junction P. The gate electrode of the third transistor T3, the gate electrode of the sixth transistor T6 and the first electrode of the fourth transistor T4 may meet to form a junction Q. The first plate of the first capacitor C1 may also be connected to the junction Q.

Further, the second plate of the second capacitor C2, the first electrode of the fifth transistor T5, the first electrode of the sixth transistor T6, and the first electrode of the seventh transistor T7 may meet to form the output terminal $G_n$ of the shift register Stage n. The gate electrode of the first transistor T1 may be connected to the output terminal $G_{n-1}$ of the shift register which is one stage lower, i.e., the $(n-1)^{th}$ stage shift register Stage (n-1). The gate electrode of the second transistor T2 may be connected to the output terminal $G_{n+1}$ of the shift register which is one stage higher, i.e., the $(n+1)^{th}$ stage shift register Stage (n+1).

In particular, the gate electrode of the first transistor T1 in the first shift register (i.e., Stage 1) may be connected to the external driving signal STP, and the gate electrode of the second transistor T2 in the last shift register (i.e., Stage N) may be connected to the output terminal of the virtual shift register (Dummy). The last shift register may be shut down by the virtual register (Dummy) through the external stop signal STPB.

Further, the second electrode of the third transistor T3, the second electrode of the fourth transistor T4, the second electrode of the sixth transistor T6, and the second electrode of the seventh transistor T7 may be connected to a low voltage signal VGL.

In one embodiment, during a forward scanning (i.e. staring from the first stage shift register Stage 1, the second stage shift register Stage 2 to the last stage shift register Stage N may gradually output the driving voltage), the first electrode of the first transistor T1 may be connected to a high voltage signal VGH, and the second electrode of the second transistor T2 may be connected to a low voltage signal VGL. The high voltage signal VGH applied to the first electrode of the first transistor T1 may charge the junction P, while the low voltage signal VGL applied to the second electrode of the second transistor T2 may discharge the junction P.

During a reverse scanning (i.e. staring from the last stage shift register Stage N, the $(N-1)^{th}$ stage shift register Stage (N-1) to the first stage shift register may gradually output the driving voltage), the first electrode of the first transistor T1 may be connected to the low voltage signal VGL, and the second electrode of the second transistor T2 may be connected to the high voltage signal VGH. The low voltage signal VGL applied to the first electrode of the first transistor T1 may discharge the junction P, while the high voltage signal VGH applied to the second electrode of the second transistor T2 may charge the junction P.

The second plate of the first capacitor C1 and the second electrode of the fifth transistor T5 may be connected to a first clock signal CKB. The gate electrode of the seventh transistor T7 may be connected to a second clock signal CK. The first clock signal CKB and the second clock signal CK may be two phase reversed or inverted clock singles. That is, the first clock signal CKB may be an inverted clock signal of the second clock signal CK and, meanwhile, the second clock signal CK may be an inverted clock signal of the first clock signal CKB.

In the disclosed embodiments, all the transistors in the shift registers may be NPN-type transistors. For example, in the forward scanning, the first electrode of the first transistor T1 may be connected to the high voltage signal VGH, charging the junction P. The second electrode of the second transistor T2 may be connected to the low voltage signal VGL, discharging the junction P.

When the junction P is not charged, the third transistor T3 may pull down the voltage at the junction P during a time period when the first clock signal CKB is at a high level, the fourth transistor T4 may be in the OFF state, and the sixth transistor T6 may pull down the output voltage Gn. When the junction P is charged, the sixth transistor T6 may be in the OFF state, the fourth transistor T4 may be in the ON state, the voltage at the junction Q may be clamped at the low voltage VGL. Thus, the third transistor T3 may be in the OFF state, and the fifth transistor T5 may pull up the output voltage Gn during the rising edge of the first clock signal CKB, while pull down the output voltage Gn during the falling edge of the first clock signal CKB.

Further, the first capacitor C1 may couple the first clock signal CKB to the junction Q, and the second capacitor C2 may be a bootstrap capacitor. In the disclosed embodiments, the fifth transistor T5 may be the pull-up transistor in the shift register, i.e., the channel width-to-length ratio of the fifth transistor T5 may be determined according to the preset number of the pixels in the pixel row driven by the shift register.

Because the channel width-to-length ratio of the pull-up transistor (i.e., the fifth transistor T5) in the shift register may be adjusted according to the preset number of the pixels in the pixel row driven by the corresponding shift register, the output voltage of each shift register may be optimized, for example, given a preset number of the pixels in the pixel row driven by the corresponding shift register. Thus, the array driving power of the driving circuit may be enhanced, and the image uniformity of the non-rectangular display screen may be improved accordingly.

For example, the non-rectangular display screen may be a circular-, triangular-, oval-shaped display screen, etc. The non-rectangular display screen may be used in wearable devices such as smartphones, automobile dashboards in which circular display screens are used for speedometers and tachometers, etc., enabling more diversified applications.

Further, referring to FIG. 1 and FIG. 3, the channel width of the pull-up transistor in the $N^{th}$ shift register stage N may be determined by the following formula:

$$W_N = W_1 + W_1 \times \left( \frac{L_N^2 - L_1^2}{L_1^2} \right) \quad (1)$$

where $W_1$ is the channel width of the pull-up transistor in the first stage shift register Stage 1, $L_1$ is the total length of the pixel row driven by the first stage shift register Stage 1, $L_N$ is the total length of the pixel row driven by the $N^{th}$ stage shift register Stage N, where N is a positive integer larger than 1. Thus, given the channel width of the pull-up transistor in the first stage shift register Stage 1 (i.e., W1), the channel width of the pull-up transistor in the other shift registers (i.e., W2 . . . $W_N$) may be calculated by Eq. (1). The channel length of the pull-up transistor in each shift register may be the same. However, in certain embodiments, the channel length of the pull-up transistor in each shift register may be different.

It should be noted that, in the disclosed embodiments, the total length of the pixel row may be the length of the preset number of pixels in the pixel row. For example, if the preset number of pixels in the pixel row is A (A is a positive integer), and the length of one pixel is B (B is a positive number), then the total length of the pixel row may be calculated as A×B.

The length of the preset number of pixels in the pixel row may be different from the total length of all the pixels in the pixel row. That is, the preset number of the pixels in the pixel row may be different from the total number of the pixels in the pixel row. However, in certain embodiments, the length of the preset number of pixels in the pixel row may be equal to the total length of all the pixels in the pixel row. That is, the preset number of the pixels in the pixel row may be equal to the total number of the pixels in the pixel row.

For illustrative purposes, a circular display screen having 240 pixel rows may be taken as an example and explained in details. In the circular display screen, the total length of the $1^{st}$ pixel row may be equal to the total length of the $240^{th}$ pixel row, the total length of the $2^{nd}$ pixel row may be equal to the total length of the $239^{th}$ pixel row, and so on. The total length of the $120^{th}$ pixel row may be equal to the total length of the $121^{st}$ pixel row. Assume the channel length of the pull-up transistor in each shift register is fixed, if the channel width of the pull-up transistor in the first stage shift register Stage 1 is 2100 μm, then according to Eq. (1), the channel width of the pull-up transistor in the $120^{th}$ stage shift register Stage 120 may be calculated to be 2300 μm. That is, given the channel width of the pull-up transistor in the first stage shift register Stage 1, the channel width of the pull-up transistor in any other shift register may be calculated according to Eq. (1).

Figure 4:
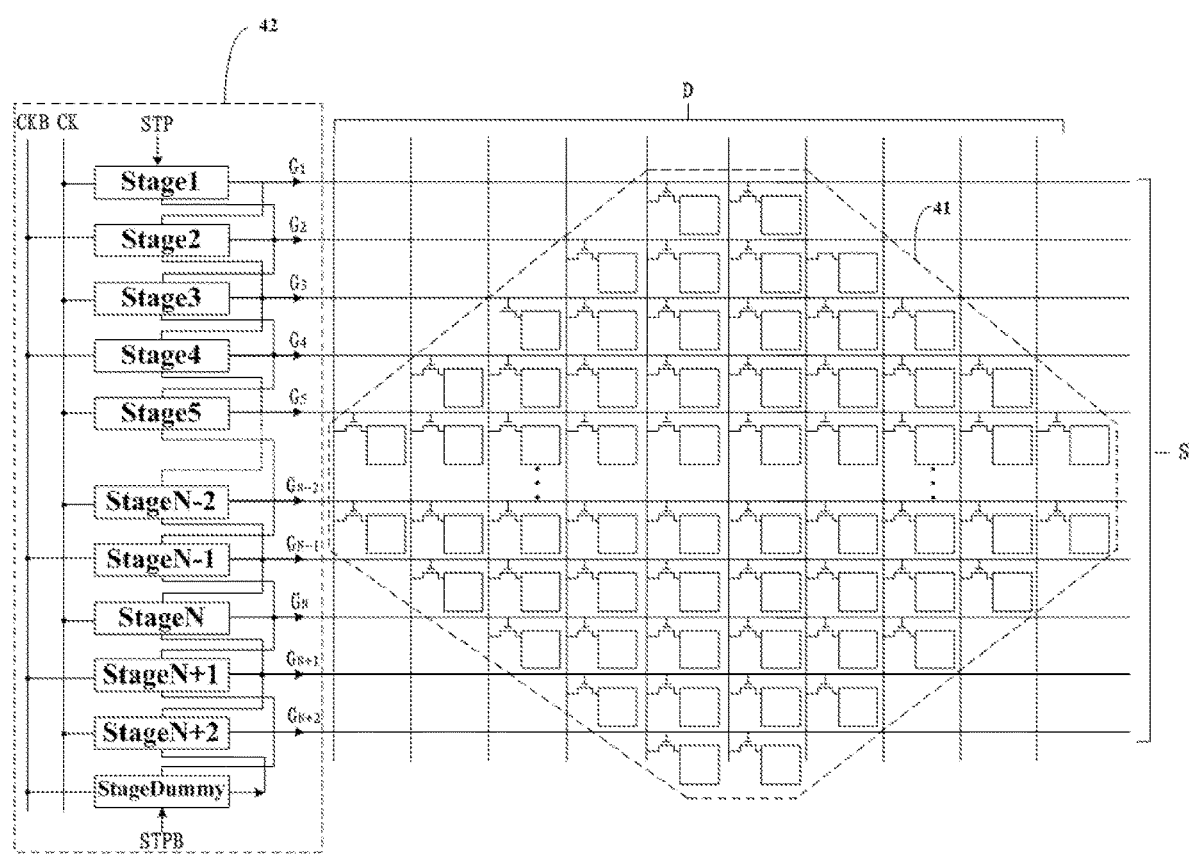
FIG. 4 illustrates a top view of an exemplary array substrate consistent with disclosed embodiments.

FIG. 4 illustrates an exemplary array substrate consistent with disclosed embodiments. As shown in FIG. 4, the array substrate may include a plurality of scanning lines S, a plurality of data lines D intersecting the scanning lines S, a pixel array 41 and any one of the disclosed driving circuits 42. The pixel array 41 may include a plurality of pixel rows. The driving circuit 42 may include a plurality of cascaded shift registers and a virtual register (Dummy) at the last stage.

The pixel array 41 may include a plurality of pixel electrodes, each pixel having a pixel electrode may be disposed at the intersection of one scanning line S and one data line D, and each pixel electrode may be controlled by a transistor, for example, a thin film transistor (TFT). Each scanning line S may be connected to the output terminal of the shift register in the driving circuit 42.

In particular, in each TFT, the gate electrode may be connected to the scanning line S, the source electrode may be is connected to the data line D, and the drain electrode may be connected to the pixel electrode controlled by the TFT. The scanning lines S may be used to turn on or turn off the TFTs.

When the shift register applies a high level signal to the scanning line S, a row of TFTs (i.e., a TFT row controlling a row of pixel electrodes or a pixel electrode row) may be turned on and, meanwhile, the data lines D may apply a driving voltage (i.e., data signal) to the pixel electrode row. Thus, liquid crystal molecules disposed within each pixel electrode in the pixel electrode row may be tilted to display an image.

For example, as shown in FIG. 4, the driving circuit 42 may include (N+2) number of cascaded shift registers (denoted as Stage 1, Stage 2 . . . Stage 5, Stage N−2 . . . Stage N+2) and a virtual register (denoted as Dummy) at the last stage, where N is a positive integer larger than 7. Each shift register may drive a pixel row, for example, the first stage shift register may drive the first pixel row, and the second stage shift register may drive the second pixel row and so on.

The pixel array 41 may be a non-rectangular array, in which from the first pixel row to the fifth pixel row, each pixel row may include a different preset number of pixels. In the drive circuit 42, each shift register may include at least one transistor whose channel width-to-length ratio may be positive correlated with the preset number of the pixels in the corresponding pixel row. For example, the first stage shift register Stage 1 may include at least one transistor whose channel width-to-length ratio may be positive correlated with the preset number of the pixels in the first pixel row. Meanwhile, the fifth stage shift register Stage 5 may include at least one transistor whose channel width-to-length ratio may be positive correlated with the preset number of the pixels in the fifth pixel row.

Further, from the $(N−2)^{th}$ pixel row to the $(N+2)^{th}$ row, each pixel row may include a different preset number of pixels. In the drive circuit 42, each shift register may include at least one transistor whose channel width-to-length ratio may be positive correlated with the preset number of pixels in the corresponding pixel row. For example, the $(N−2)^{th}$ stage shift register Stage (N−2) may include at least one transistor whose channel width-to-length ratio may be positive correlated with the preset number of the pixels in the $(N-2)^{th}$ pixel row. Meanwhile, the $(N+2)^{th}$ stage shift register Stage (N+2) may include at least one transistor whose channel width-to-length ratio may be positive correlated with the preset number of the pixels in the $(N+2)^{th}$ pixel row.

In the driving circuit 42 of the pixel array 41, the channel width-to-length ratio of the pull-up transistor in the shift register may be adjusted according to the preset number of the pixels in the pixel row driven by the corresponding shift register. Thus, the output voltage of each shift register may be optimized, for example, given a preset number of the pixels in the pixel row driven by the corresponding shift register. The driving power of the driving circuit 42 may be enhanced, and the image uniformity of the non-rectangular display screen may be improved accordingly.

Figure 5:
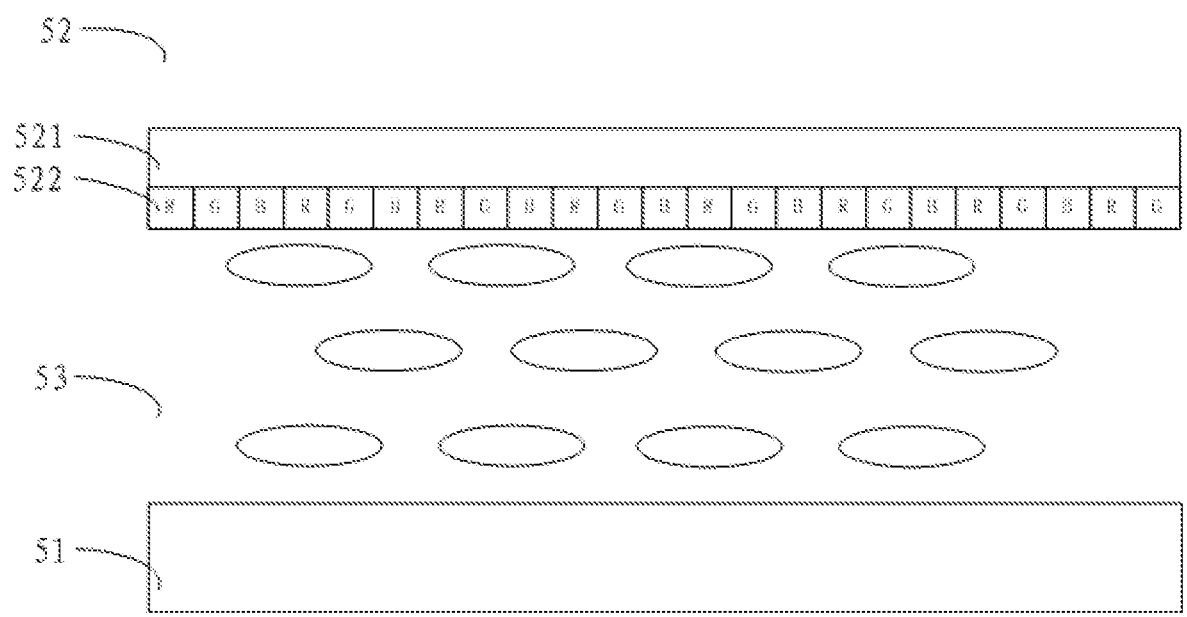
FIG. 5 illustrates a cross-sectional view of an exemplary display device consistent with disclosed embodiments.

Based on the disclosed array substrate, the present disclosure further provides a display device. FIG. 5 illustrates a cross-sectional view of an exemplary display device consistent with disclosed embodiments. As shown in FIG. 5, the display device may include any one of the disclosed array substrates 51, an opposite substrate 52 disposed opposite to the array substrate 51, and a liquid crystal layer 53 disposed between the array substrates 51 and the opposite substrate 52.

Further, the opposite substrate 52 may include a first substrate 521 and a color film layer 522, and the color film layer 522 may be disposed on a surface of the first substrate 521 facing the liquid crystal layer 53. The color film layer 522 may include a color film unit array, which may include a plurality of red color film units (R), a plurality of green color film units (G) and a plurality of blue color film units (B). The red color film units (R), the green color film units (G) and the blue color film units (B) may be alternately arranged. The color film unit array may correspond to the pixel array included in the array substrate 51. The color film unit array may also be a non-rectangular array.

Figure 6:
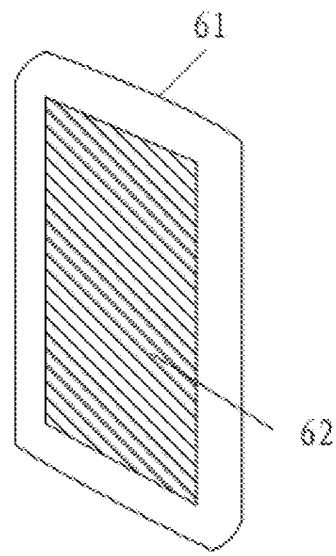
FIG. 6 illustrates a schematic diagram of another exemplary display device consistent with disclosed embodiments.

FIG. 6 illustrates a schematic diagram of another exemplary display device consistent with disclosed embodiments. As shown in FIG. 6, the display device may be a tablet 61 including any one of the disclosed array substrates 62. The display device may also be a TV, a smartphone, a notebook, and a smartwatch including any one of the disclosed array substrates 62, etc. Further, the display device may be any appropriate type of content-presentation devices including any one of the disclosed array substrates 62. The display device may have a non-rectangular display screen. For example, the non-rectangular display screen may be a circular-, triangular-, oval-shaped display screen, etc. In certain embodiments, the display device may also have a rectangular display screen.

In the disclosed display device, each shift register may drive the gate electrodes in a row of pixel TFTs (i.e., a pixel TFT row). That is, each shift register may drive a row of pixels (i.e., a pixel row). A plurality of pixel TFT rows may be gradually scanned to display image content. For example, during a fresh cycle (i.e., a forward scanning or a reverse scanning), the plurality of pixel TFT rows may be gradually switched on by the driving voltage outputted by the shift registers. Meanwhile, source signals (i.e., column voltage signals) may be applied to the source electrodes of the pixel TFT row. The drain electrode of the TFT may be connect to the liquid crystal which may be equivalent to a capacitor in a circuit. Because all the other pixel TFT rows that the column intersects are turned off, only the LC capacitors at the designated pixels may receive the voltage. The LC capacitor may be able to hold the voltage (i.e., display image content) until the next refresh cycle, i.e., the pixel may keep switched on until the next refresh cycle.

Referring to FIG. 5 and FIG. 6, because the disclosed display device may include any one of the disclosed array substrates, the disclosed display device may also have the advantages of the disclosed array substrates. That is, in the driving circuit of the pixel array in the display device, the channel width-to-length ratio of the pull-up transistor in the shift register may be adjusted according to the preset number of the pixels in the pixel row driven by the corresponding shift register. Thus, the output voltage of each shift register may be optimized, for example, given a preset number of the pixels in the pixel row driven by the corresponding shift register. The driving power of the driving circuit may be enhanced, and the image uniformity of the non-rectangular display screen may be improved accordingly.

The disclosed display devices with the non-rectangular display screen may be used in wearable devices such as smartphones, or automobile dashboards in which circular display screens are used for speedometers and tachometers. A circular display screen would save precious space in a vehicle's crowded dashboard, which also requires room for car-navigation displays and other recent additions. Further, the disclosed display devices may become more and more attractive to advertisers because they may enhance the image uniformity, enlarge the viewing angle, attract attention by their unconventional shapes, better merge with architectural landscape, etc.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A driving circuit, comprising:
a plurality of cascaded shift registers sequentially sorted as a first stage cascaded shift register to an $N^{th}$ stage cascaded shift register, N being a positive integer larger than 1,
wherein each of the plurality of cascaded shift registers includes a plurality of transistors and at least one capacitor, and each of the plurality of cascaded shift registers is configured to drive a corresponding pixel row in a plurality of pixel rows,
in the each of the plurality of cascaded shift registers, a channel width-to-length ratio of at least one of the plurality of transistors is determined by a preset number of pixels in the corresponding pixel row, the preset number of the pixels in the corresponding pixel row being smaller than or equal to a total number of the pixels in the corresponding pixel row, and
a channel width $W_n$, of the at least one of the plurality of transistors of an $n^{th}$ stage cascaded shift register is determined by a formula as follows:

$$W_n = W_1 + W_1 \times \left( \frac{L_n^2 - L_1^2}{L_1^2} \right)$$

wherein $W_1$ is a channel width of the at least one of the plurality of transistors in the first stage cascaded shift register, $L_1$ is a total length of the corresponding pixel row driven by the first stage cascaded shift register, $L_n$ is a total length of the corresponding pixel row driven by the $n^{th}$ stage cascaded shift register, and n is a positive integer larger than 1 but smaller than or equal to N.

2. The driving circuit according to claim 1, wherein: the channel width-to-length ratio of the at least one of the plurality of transistors is positively correlated with the preset number of the pixels in the corresponding pixel row,
   wherein the term "positively correlated" refers to that the channel width-to-length ratio of the at least one of the plurality of transistors is linearly or nonlinearly proportional to the preset number of the pixels in the corresponding pixel row.

3. The driving circuit according to claim 1, wherein: the at least one of the plurality of transistors is a pull-up transistor.

4. The driving circuit according to claim 3, wherein: the total length of the corresponding pixel row driven by the each of the plurality of cascaded shift registers is a length of the preset number of the pixels in the corresponding pixel row driven by the each of the plurality of cascaded shift registers.

5. The driving circuit according to claim 1, wherein the plurality of transistors in the each of the plurality of cascaded shift registers include:
   a first transistor having a second electrode connected to a junction P, and a gate electrode connected to an output terminal of a cascaded shift register one stage lower;
   a second transistor having a first electrode connected to the junction P, and a gate electrode connected to an output terminal of a cascaded shift register one stage higher;
   a third transistor junction P having a first electrode connected to the junction P, a gate electrode connected to a junction Q, and a second electrode connected to a low voltage signal discharging the junction P;
   a fourth transistor having a gate electrode connected to the junction P, a first electrode connected to the junction Q, and a second electrode connected to the low voltage signal;
   a fifth transistor having a gate electrode connected to the junction P, and a first electrode connected to an output terminal of the each of the plurality of the plurality of cascaded shift registers;
   a sixth transistor having a gate electrode connected to the junction Q, a first electrode connected to the output terminal of the each of the plurality of the plurality of cascaded shift registers, and a second electrode connected to the low voltage signal;
   a seventh transistor having a first electrode connected to the output terminal of the each of the plurality of the plurality of cascaded shift registers, and a second electrode connected to the low voltage signal;
   a first capacitor having a first plate connected to the junction and a second plate connected to the output terminal of the each of the plurality of the plurality of cascaded shift registers; and a second capacitor having a first plate connected to the junction P,
   wherein the second electrode of the first transistor, the first electrode of the second transistor, the first electrode of the third transistor, the gate electrode of the fourth transistor, and the gate electrode of the fifth transistor meet to form the junction P,
   the gate electrode of the third transistor, the gate electrode of the sixth transistor, and the first electrode of the fourth transistor meet to form the junction Q,
   the fifth transistor is the at least one of the plurality of transistors,
   the first capacitor is the at least one capacitor, and
   the channel width-to-length ratio of the fifth transistor is determined by the preset a second number of the pixels in the corresponding pixel row.

6. The driving circuit according to claim 5, wherein: the fifth transistor is a pull-up transistor.

7. The driving circuit according to claim 5, wherein: the gate electrode of the first transistor in the first stage cascaded shift register is connected to an external driving signal.

8. The driving circuit according to claim 5, further including:
   a virtual shift register,
   wherein the gate electrode of the second transistor in the $N^{th}$ stage cascaded shift register is connected to an output terminal of the virtual shift register.

9. The driving circuit according to claim 5, wherein:
   a first electrode of the first transistor is connected to a high voltage signal charging the junction P; and
   a second electrode of the second transistor is connected to the low voltage signal.

10. The driving circuit according to claim 5, wherein:
    a first electrode of the first transistor is connected to the low voltage signal; and
    a second electrode of the second transistor is connected to a high voltage signal charging the junction P.

11. The driving circuit according to claim 5, wherein:
    the second plate of the first capacitor and a second electrode of the fifth transistor are connected to a first clock signal; and
    the gate electrode of the seventh transistor is connected to a second clock signal,
    wherein the first clock signal and the second clock signal are two phase reversed clock signals.

12. The driving circuit according to claim 1, wherein:
    the at least one of the plurality of transistors is a pull-up transistor.

13. An array substrate, comprising:
    a non-rectangular pixel array including a plurality of pixels arranged in a plurality of pixel rows; and
    a driving circuit including a plurality of cascaded shift registers sequentially sorted as a first stage cascaded shift register to an $N^{th}$ stage cascaded shift register, N being a positive integer larger than 1,
    wherein each of the plurality of cascaded shift registers includes a plurality of transistors and at least one capacitor, and each of the plurality of cascaded shift registers is configured to drive a corresponding pixel row in the plurality of pixel rows,
    in the each of the plurality of cascaded shift registers, a channel width-to-length ratio of at least one of the plurality of transistors is determined by a preset number of pixels in the corresponding pixel row, the preset number of the pixels in the corresponding pixel row being smaller than or equal to a total number of the pixels in the corresponding pixel row, and
    a channel width $W_n$, of the at least one of the plurality of transistors of an $n^{th}$ stage cascaded shift register is determined by a formula as follows:

$$W_n = W_1 + W_1 \times \left(\frac{L_n^2 - L_1^2}{L_1^2}\right)$$

wherein $W_1$ is a channel width of the at least one of the plurality of transistors in the first stage cascaded shift register, $L_1$ is a total length of the corresponding pixel row driven by the first stage cascaded shift register, $L_n$ is a total length of the corresponding pixel row driven by the $n^{th}$ stage cascaded shift register, and n is a positive integer larger than 1 but smaller than or equal to N.

14. The array substrate according to claim 13, wherein: the driving circuit is integrated on the array substrate.

15. A display device, comprising:
an array substrate including:
  a non-rectangular pixel array including a plurality of pixels arranged in a plurality of pixel rows; and
  a driving circuit having a plurality of cascaded shift registers sequentially sorted as a first stage cascaded shift register to an $N^{th}$ stage cascaded shift register, N being a positive integer larger than 1,
wherein each of the plurality of cascaded shift registers includes a plurality of transistors and at least one capacitor, and each of the plurality of cascaded shift registers is configured to drive a corresponding pixel row in the plurality of pixel rows,
in the each of the plurality of cascaded shift registers, a channel width-to-length ratio of at least one of the plurality of transistors is determined by a preset number of pixels in the corresponding pixel row, the preset number of the pixels in the corresponding pixel row being smaller than or equal to a total number of the pixels in the corresponding pixel row, and
a channel width $W_n$ of the at least one of the plurality of transistors of an $n^{th}$ stage cascaded shift register is determined by a formula as follows:

$$W_n = W_1 + W_1 \times \left(\frac{L_n^2 - L_1^2}{L_1^2}\right)$$

wherein $W_1$ is a channel width of the at least one of the plurality of transistors in the first stage cascaded shift register, $L_1$ is a total length of the corresponding pixel row driven by the first stage cascaded shift register, $L_n$ is a total length of the corresponding pixel row driven by the $n^{th}$ stage cascaded shift register, and a is a positive integer larger than 1 but smaller than or equal to N.

\* \* \* \* \*